United States Patent [19]
Brutchen et al.
[11] 3,898,087
[45] Aug. 5, 1975

[54] PHOTOPOLYMERIZABLE COMPOSITIONS CONTAINING AMINIMIDES

[75] Inventors: George W. Brutchen, Carlos; Gene O. Fanger, Muncie, both of Ind.
[73] Assignee: Ball Corporation, Muncie, Ind.

[22] Filed: June 14, 1974
[21] Appl. No.: 479,240

[52] U.S. Cl. ...................... 96/33; 96/35.1; 96/36.2; 96/36.3; 96/115 P; 204/159.16; 204/159.24
[51] Int. Cl. ...................... G03c 1/70
[58] Field of Search ...................... 96/115 P, 33, 35.1; 204/159.16, 159.24

[56] References Cited

UNITED STATES PATENTS

| | | | |
|---|---|---|---|
| 3,388,995 | 6/1968 | Schwerin et al. | 96/115 P |
| 3,630,746 | 12/1971 | Takimoto et al. | 96/115 P |

FOREIGN PATENTS OR APPLICATIONS

| | | | |
|---|---|---|---|
| 906,143 | 9/1962 | United Kingdom | 96/115 P |

*Primary Examiner*—Ronald H. Smith
*Attorney, Agent, or Firm*—Gilbert E. Alberding

[57] ABSTRACT

Photopolymerizable compositions herein described comprising an aqueous mixture of a water-insoluble resin such as polyvinyl acetate, polyvinyl acrylate, etc., a water-soluble binder such as polyvinyl alcohol, polyvinyl pyrrolidone, etc., a photopolymerization initiator selected from the group consisting essentially of uranyl nitrate, uranyl phosphate, uranyl chloride, uranyl carbonate, and uranyl dibutyl phosphate, and an aminimide represented by the general structural formula:

$$R—N^+(CH_3)_2N^-—C(O)C(CH_3):CH_2$$

wherein R is a radical selected from the group consisting of $—CH_3$, $—CH_2CH(OH)CH_3$, $—CH_2CH(OH)CH$ 2OH, $—CH_2CH(OH)(CH_2)_5CH_3$ and $—CH_2CH(OH)(CH_2)_7CH_3$.

14 Claims, No Drawings

PHOTOPOLYMERIZABLE COMPOSITIONS CONTAINING AMINIMIDES

BACKGROUND OF THE INVENTION

This invention relates generally to a new photopolymerizable composition for use in photolithography and photomechanical processes, and more particularly to an inherently light sensitive photopolymerizable composition for such use.

Printing plates having photopolymerizable compositions coated thereon are well-known in the art and have become more popular in the printing industry. The compositions themselves generally comprise a colloidal layer of arabic gum or other similar material containing a photosensitive hardening agent such as a bichromate salt. As of late, the use of light sensitive diazo compounds have made substantial impact upon the printing industry. At any rate, the bichromated colloid as well as the diazo compounds have several material disadvantages which restrict their application and use. One such inherent disadvantage of the bichromated colloids is that they deteriorate relatively rapidly after coating, thus making them unsuitable for use when long shelf life is desired. Moreover, many of the colloidal light sensitive materials presently employed have photopolymerizable compositions requiring relatively high temperature oven bake after exposure and development but prior to use, thereby increasing the overall cost and complicating the process of preparation. As regards the diazo compounds, they seemingly have a tendency to decompose chemically upon contact with a metal surface. Consequently, when a diazo compound is to be used over a metal plate, an intervening protective sublayer must be used. It is known that if the sublayer is not properly formed, the resulting lithographic plate may be defective or have a short storage life.

Plates having photopolymerizable compositions coated thereon are processed by exposing imagewise such compositions to actinic radiation whereby certain photoinitiators incorporated therein become activated and induce the polymerization of the materials. Thus, an exposed coated plate results in polymerized and unpolymerized areas in imagewise distribution corresponding to the light and dark areas, respectively, of a master used for the exposure. It is known that the exposed plate may be used in a variety of ways. For example, treatment with a suitable solvent that dissolves the unpolymerized material, but not the polymer results in a relief plate; proper selection of monomer and other ingredients gives a transfer element the unpolymerized areas of which can be transferred to a separate receptor sheet; the ingredients can be chosen so that either the polymerized or the unpolymerized areas are selectively ink receptive, thus giving an element useful for positive or negative offset printing.

One important application of photopolymerizable printing plates is in letter press printing. As is known, letterpress printing is one in which raised inked surfaces come in direct contact with the substrate, such as paper, and the impression or image is transferred. Here the relief plates must "read wrong" because the impression on the substrate or stock, which must "read right" comes in direct contact with the relief plate. These treated plates require a relief-image, the raised areas of which are capable of being suitably inked by various means and pressed against a working surface, e.g., a sheet of paper, thus giving a print. The wide commercial acceptance of these printing plates has resulted primarily from their ease of formation and the fine print quality resulting therefrom. Further, it has been found that such printing plates have a press life comparable to the much more expensive metal plates, such as zinc and magnesium.

Although the amount of relief can be adequately controlled, there are certain preferred ranges which give best results under commercial operation. To be used in original printing presses the relief thickness of the printing plate generally are from about 0.015 to about 0.040 inch deep. Generally, this depth is required in order to prevent large non-printing areas from picking up any ink and transferring it to a receiving substrate. The printing surface can generally be described as a combination of halftone dots and solid relief portions comprising a multiplicity of minute wells. The former being the highlight halftone areas, the latter being the shadow areas. In small non-printing areas, e.g., the small ink collecting areas or wells in the shadow areas, the relief is considerably shallower, of the order of about 0.004 to about 0.008 inch wereas in the highly halftone area, the relief is in the order of about 0.012 to about 0.038.

Because of the use of precision printing presses in which the inking operation of a plate is performed accurately there is less requirement that the relief height be very great. That is to say that precision printing presses do not require the height necessary associated with ordinary presses and can utilize must thinner printing plates. Further, the so-called dry off set process requires only a nominal relief and thus a very thin printing plate can be utilized.

The commercially available printing plate utilizing photopolymerizable compositions has many advantages in that they can be readily prepared, that the images produced thereon show good resolution and remarkably sharp detail, and that the materials used when discarded are less harsh upon the ecology. Nevertheless, the commercially available plate has certain disadvantages in that the starting photopolymerizable compositions are generally expensive, that special organic chemicals are needed for washing out these plates, and that the handling of these plates require an environment from which ultra-violet rays are totally excluded. In contrast to the now available printing plates, the photopolymerizable compositions described herein retain the advantages of the printing characteristics of the conventional plates, but have added advantages in that the compositions are relatively inexpensive, can be washed with ordinary tap water, have enhanced storage or shelf life without special safeguards, and can be used in a wide range of applications.

SUMMARY OF THE INVENTION

Briefly, in accordance with this invention, a photopolymerizable composition is disclosed comprising an aqueous mixture of a water-insoluble resin, a water-soluble binder, a photopolymerization initiator consisting of at least one uranyl salt, and an aminimide.

An object of this invention is to provide new and practical photosensitive elements. Another object is to provide such elements that are simple, inexpensive and dependable. A further object is to provide for utilizing certain compositions containing aminimides in the preparation of compositions for printing plates.

The aminimides are a group of water-soluble compounds that are isocyanate precursors having a dipolar ion characteristic which seemingly contributes to their solubility and neutrality. The aminimides useful in the compositions herein disclosed include the following:

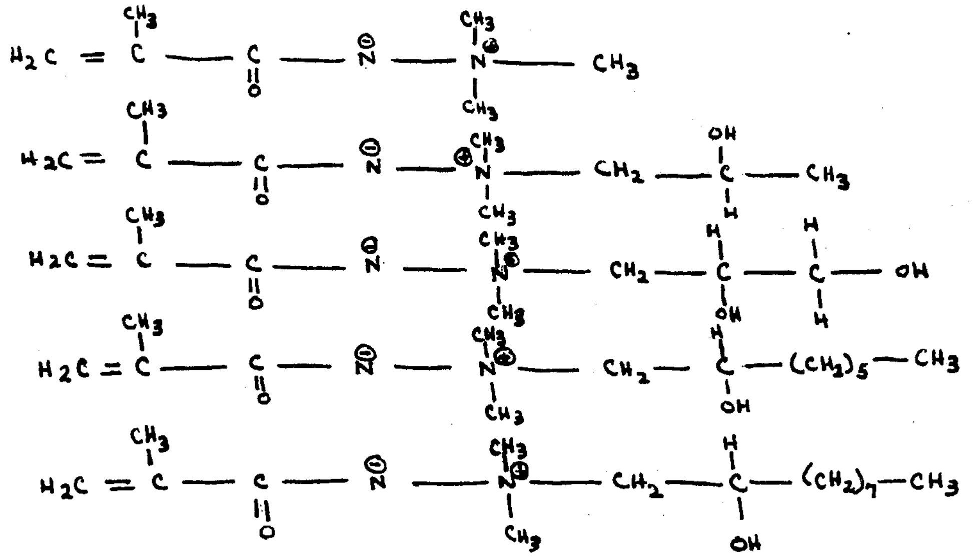

The water-insoluble resins usable in the compositions referred to herein denote generally those polymers in which there are vinyl esters, especially vinyl acetate monomers incorporated in the polymeric chain. All polyvinyl ester polymers or polymers formed by condensation of aceteldehyde or any other aldehyde with polyvinyl alcohol or any polymer or copolymers of the acetal group may be used as the waterinsoluble resins. The vinyl esters may be copolymerized with any of the known photopolymerizable organic vinyl compounds, i.e., compounds containing a single H2C=< group as the sole site of additional polymerization. Typically suitable monomers include acrylyl and alkacrylyl compounds, e.g., acrylic, haloacrylic, and methacrylic acids, esters, nitriles and amides such as acrylonitrile, methyl methacrylate, ethyl methacrylate, butyl methacrylate, octyl methacrylate, cyclohexyl methacrylate, methoxymethyl methacrylate, chloroethyl methacrylate, methacrylic acid, ethylacrylate, calcium acrylate, and alpha chloroacrylic acid, vinyl and vinylidene halides such as vinyl chlorides, vinyl fluoride, vinylidene chloride, vinylidene fluoride, vinyl carboxylates; N-vinyl imides such as N-vinyl phthalimide and N-vinyl succinimide; N-vinyl lactams such as N-vinylcaprolactam; vinylaryls such as styrene and other vinyl derivatives including vinyl pyrrolidone. Further, copolymers of methyl acrylate or ethyl acrylate with up to about 30 or more by weight of acrylonitrile are suitable water-insoluble polymers for the mixtures herein disclosed. Mixtures of any two or more of the above mentioned monomers may also be utilized. It should be pointed out that these water-insoluble resins assume a form or configuration in an emulsion of that of a sphere, spheroid, lenticular shape, etc., while being surrounded by a water-soluble matrix or layer of an organic binder material to be hereinafter.

The water-soluble binders useful herein include the synthetic and natural binders, preferrably poly (vinyl alcohol) or copolymers containing vinyl alcohol units. Generally, polyvinyls are preferrable in view of their ease in coating. Such alcohols or copolymers thereof are conventionally produced via alcoholysis of polymerizable acetate with methanol. Any other unit of polymerizable monomers, especially vinyl polymers, may be present as non-reactive polymer components in the copolymer, for instance, units of ethylene, propylene, butylene, butadiene, isoprene, vinyl chloride, vinylidene chloride, vinyl ester, partially hydrolyzed vinyl acetate and vinyl propionate, vinyl ether, for instance, vinyl propyl ether, vinyl isobutyl ether, acrylic or methacrylic acid, or derivatives thereof, such as esters, particularly those obtained with aliphatic alcohols containing at most five carbon atoms, acrylonitrile, methacrylonitrile, butadiene, maleic anhydride, styrene, and so on. Also suitable as water-soluble binders are the natural polymers including cellulose, starch, and gelatin, or modified derivatives thereof, e.g., carboxy methylcellulose, of these natural substances such as, for an example, partly esterified or etherified cellulose. Generally, the binders are water-soluble or materials having hydrophilic properties, such materials being easily washed out or dissolved by a suitable developing solution in accordance with the methods disclosed herein.

The water-insoluble polymers in conjunction with the binders described herein form emulsions; thus, when placed in contact with a binder such polyvinyl alcohols forms a coating of polyvinyl alcohol around individual particles of the polymer, through which the polymer particles are prevented from being joined with polymer particles proximate thereto when the emulsion is dried to form a coating. Seemingly, the polyvinyl alcohol serves as a dispersant or coating agent upon the polymer particles, and maintains the particles from one another. If no polyvinyl alcohol were added to the polymer, then the polymer particle would have the tendency to be joined together upon drying and the film produced would be insoluble in water.

The uranyl salt are compounds which may be generally represented by the formula $UO_2X_2$, wherein X is an acid residue of monovalency. Representative uranyl salts include uranyl chloride, uranyl nitrate, uranyl acetate, uranyl carbonate, uranyl sulfate, uranyl phosphate, and uranyl dibutyl phosphate. The amount of this uranyl salt may vary over a wide range. Generally however it has been found that from about 0.2 parts by weight to about 5.0 parts by weight of the polymeric mixtures may be incorporated.

It has been found that in the presence of the aminimide compounds herein disclosed with the uranyl salts are very stable and do not reduce to the metal. Surprisingly, it has been found that a composition comprising polyvinyl acetate, polyvinyl alcohol, dimethyl (2-hydroxypropyl) amine methacrylimide and uranyl nitrate renders a coating when exposed and washed with a reversal of images, that is, a relief image that is opposite of the starting negative. This reverse image results from the fact that the exposed portions to actinic light becomes more soluble than the unexposed portions.

If desired, a number of cross-linking agents may be incorporated into the compositions herein disclosed to render a more photohardenable composition. One such cross-linking agent found effective herein is N,N'-methylene bisacrylamide.

It is preferrable to add the photosensitive compositions herein disclosed to a support in the form of a mixture or dispersion which dries as a film. Deposition of films or coatings of the photosensitive compositions herein disclosed may be carried out according to any known process. They may be either sprayed, whirled, or brushed onto a supporting surface or coated by dipping or by ordinary emulsion coating techniques, and the coating then dried and exposed to light through a transparancy and finally washed with water. The image is generally delicate when wet, but on drying becomes very durable and may be left in the form or may be protected with a lacquer coating. Suitable bases are metal sheets such as copper, aluminum, zinc, magnesium, glass, cellulose, ester films, polyvinyl acetate films, poly styrene films, poly (ethylene terephthalate), and the like.

After the support member has been coated with a film of the photopolymerizable resin compositions disclosed herein, it is dried and then exposed to light as herein described, preferably ultraviolet light although a wide range of different light sources may be used, depending upon the structure of the light sensitive polymer and on the initiator used through a stencil or negative, template or pattern. The exposure to such light polymerizes the composition by producing cross-linking or dimerisation of the double bonds of the polymeric material, and thereby converts the polymer from one with which is soluble to one which is insoluble. Such crosslinking also makes the polymer stronger and more resistant to acids, alkali and solvents. The duration of the exposure is, of course, widely variable depending upon the intensity of the light source, the precise position of the polymer, the thickness of the film, etc. The exposure will generally be equivalent to about 10 to 20 lux units at 3,000 foot candles. The unexposed area will, of course, remain soluble thereby enabling the image to be developed. The exposed support and polymer film is washed with water to remove the non-exposed areas.

If desired, various plasticizers may be admixed with the present formulation defined herein to afford and facilitate flexibility and toughness as needed. Although a wide range of plasticizers are known, the water-dispersable esters have been found most suitable. Illustrative of the plasticizers is dibutyl sebacate, tricresyl phosphate, diethyl phosphate, etc. Generally, the amount of plasticizer may vary over a wide range depending on the desired product, however, amounts from about 0.5 percent to about 5 percent in the polymer renders very suitable compositions.

There may be included in the photopolymerizable compositions other materials to enhance certain properties and include fillers such as talc, and various pigments, and well-known compounds which serve as effective accelerators of the photopolymerization by facilitating the formation of cross-linkages.

It has been found that the compositions of the subject invention are quite stable if stored away from strong actinic light. Further, it may be desirable to include a small quantity of a polymerization inhibitor sufficient to maintain the stability of the polymer, but insufficient to prevent or materially effect polymerization when the composition is later exposed to the actinic light.

Printing plates prepared from the compositions of this invention are characterized by improved qualities of ink receptivity, by the retention of such ink receptivity even after long continued use. The compositions herein are also considerably more resistant both to water and to acids than films prepared from conventional compositions and are characterized by greater durability and superior printing qualities.

The following Examples are given by way of illustration and not limitation. In the Examples, all of the percentages and proportions are given by weight.

EXAMPLE I

A water base emulsion containing 25 parts by weight of a water base emulsion of polyvinyl acetate (about 55 percent solids) was throughly mixed with 6 parts by weight of a partially hydrolyzed polyvinyl acetate having a degree of hydrolysis of about 82 mol percent, average polymerization degree of about 500. To this aqueous mixture was added 0.50 parts by weight of dimethyl (2-hydroxylpropyl) amine methacrylimide and about 0.5 parts by weight of N,N'-methylene bisacrylamide, to which was added 2.25 parts by weight of a 50 percent aqueous solution of uranyl nitrate.

The aqueous mixture thus prepared was thoroughly mixed and a coating thereof applied onto an aluminum plate and allowed to dry. The coating after drying was about 15 mils in thickness and had a moisture content of about 6 percent. Thereafter, the coated plate was exposed using a 5 KV Ascor Addalux ultraviolet metal halide diazo lamp at a distance of about 24 inches for about 1.75 minutes through a master negative a graduated density step table. The unexposed portions were removed by allowing running water to play over the coating in the form of a pressurized spray which removed the unexposed portions therefrom.

There were excellent bonding between the metal surface and the polymeric material; there was a fine detail given throughout the treated plate reproducing in detail the master negative. A conventional printing ink was rolled onto the relief surface of the plate and rendered a splendid reproduction of the images of the original step tablet.

EXAMPLE II

A water base emulsion containing about 25 parts by weight of a water base emulsion of polyvinyl acetate (about 55 percent by weight solid) was thoroughly mixed with about 6 parts by weight of a partially hydrolyzed polyvinyl acetate having a degree of hydrolysis of about 82 mol percent, average polymerization degree of about 500. To this aqueous mixture was added about 0.5 parts by weight of dimethyl (2-hydroxypropyl) amine methacrylimide to which was added about 2.25 parts by weight of a 50 percent aqueous of uranyl nitrate.

The aqueous mixture thus prepared was thoroughly mixed and a coating thereof applied onto an aluminum plate and allowed to dry. The coating after drying was about 15 mils in thickness and had a moisture content of about 6 percent. Thereafter, the coated plate was exposed using a 5 KV Ascor Addalux ultraviolet metal halide diazo lamp at a distance of about 24 inches for about 1.75 minutes through a master negative, a graduated density step table. It was found that the exposed portions were easily washed away by allowing running water to play over the total coated surface in the form of a pressurized spray.

The process and compositions herein are useful in not only the preparation of printing plates, but also for preparing other metal articles wherein selected parts are removed or treated by various reagents, etching compositions, in the preparation of printed circuits.

It is understood that the invention is not restricted to any of the specific embodiments described hereinabove, but includes all such variations, modifications, and equivalents as fall within the scope of the appended claims.

We claim:

1. A photopolymerizable composition comprising an aqueous mixture of a water-insoluble resin, a water soluble binder, a photopolymerization initiator consisting of at least one uranyl salt, and an aminimide represented by the general formula:

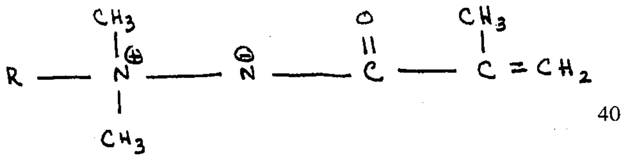

wherein R is a radical selected from the group consisting of $-CH_3$, $-CH_2CH(OH)CH_3$, $-CH_2CH(OH)CH_2OH$, $-CH_2CH(OH)(CH_2)_5CH_3$, and $-CH_2CH(OH)(CH_2)_7CH_3$.

2. A photopolymerizable composition as recited in claim 1 wherein the water-insoluble resin is a member selected from the group consisting of polyvinyl acetate, polyvinyl acrylate, polyvinyl methacrylate, polyvinyl acetate-acrylate, polyterpene, polystyrene and mixtures thereof.

3. A photopolymerizable composition as recited in claim 1 wherein the binder is a member selected from the group consisting of polyvinyl alcohol, polyvinyl pyrrolidone, carboxylmethyl cellulose, polyacrylamide, alginate salts, gelatin and mixtures thereof.

4. A photopolymerizable composition as recited in claim 1 wherein the uranyl salt is a member selected from the group consisting of uranyl sulfate, uranyl phosphate, uranyl chloride, uranyl nitrate, uranyl carbonate, uranyl dibutyl phosphate, and mixtures thereof.

5. A photopolymerizable composition as recited in claim 1 wherein the aminimide is 1,1-dimethyl-1-(2-hydroxypropyl) amine methacrylimide.

6. A photopolymerizable composition as recited in claim 1 wherein there is incorporated therein N,N'-methylene bisacrylamide.

7. A photopolymerizable composition comprising an aqueous mixture of a water-insoluble resin selected from the group consisting of polyvinyl acetate, polyvinyl acrylate, polyvinyl methacrylate, polyvinyl acetate-acrylate, polyterpene, polystyrene and mixtures thereof, a watersoluble binder selected from the group consisting of polyvinyl alcohol, polyvinyl pyrrolidone, carboxylmethyl cellulose, polyacrylamide, alginate salts, gelatin and mixtures thereof, a photopolymerization initiator consisting of at least one uranyl salt, and an aminimide represented by the general formula:

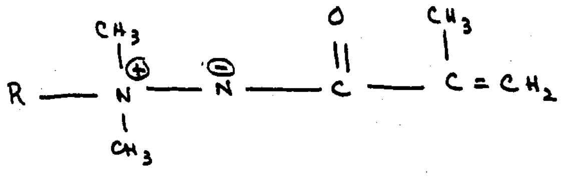

whereing R is a radical selected from the group consisting of $-CH_3$, $-CH_2CH(OH)CH_3$, $-CH_2CH(OH)CH_2OH$, $-CH_2CH(OH)(CH_2)_5CH_3$, and $-CH_2CH(OH)(CH_2)_7CH_3$.

8. A photopolymerizable composition as recited in claim 7 wherein the uranyl salt is uranyl nitrate.

9. A photopolymerizable composition comprising an aqueous mixture of from 0 to about 80 parts by weight based upon the weight of said mixture of a water-insoluble resin selected from the group consisting of polyvinyl acetate, polyvinyl acrylate, polyvinyl methacrylate, polyvinyl acetateacrylate, polyterpene, polystyrene, and mixtures thereof, from about 5 to about 90 parts by weight of a water-soluble binder selected from the group consisting of polyvinyl alcohol, polyvinyl pyrrolidone, carboxylmethyl cellulose, polyacrylamide, alginate salts, gelatin and mixtures thereof, from about 0.2 to about 5.0 parts by weight of a phtopolymerization initiator consisting of at least one uranyl salt, and from about 5 to about 45 parts by weight aminimide represented by the general formula:

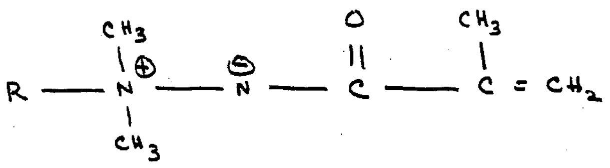

wherein R is a radical selected from the group consisting of $-CH_3$, $-CH_2CH(OH)CH_3$, $-CH_2CH(OH)CH_2OH$, $-CH_2CH(OH)(CHCH_2)_5CH_3$, and $-CH_2CH(OH)(CH_2)_7CH_33$.

10. A photopolymerizable composition as recited in claim 9 wherein there is incorporated therein from 0 to about 5 parts by weight of N,N'-methylene bisacrylamide.

11. A method of forming a photosensitive element comprising coating a substrate with a composition comprising an aqueous mixture of a water-insoluble resin, a watersoluble binder, a photopolymerization initiator consisting of at least one uranyl salt, and an aminimide represented by the general formula:

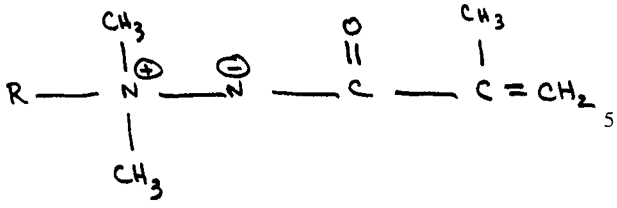

wherein R is a radical selected from the group consisting of —$CH_3$, —$CH_2CH(OH)CH_3$, —$CH_2CH(OH)CH_2OH$, —$CH_2CH(OH)(CH_2)_5CH_3$, and —$CH_2CH(OH)(CH_2)_7CH_3$, drying the coating whereby the water-insoluble resins are maintained in their emulsion configuration, exposing imagewise the dried composition coated upon the substrate to actinic light, fixing the exposed and unexposed portions by washing with water.

12. The method as recited in claim 11 wherein the drying is carried out below a temperature of about 150°F.

13. A method of forming a photopolymerizable element comprising coating a substrate with a composition of from 0 to about 80 parts by weight based upon the weight of the aqueous mixture, water-insoluble resin, selected from the group consisting of polyvinyl acetate, polyvinyl acrylate, polyvinyl acetate-acrylate, polyterpene, polystyrene, and mixtures thereof, from about 5 to about 90 parts by weight water-soluble binder selected from the group consisting of polyvinyl alcohol, polyvinyl pyrrolidone, carboxylmethyl cellulose, polyacrylamide, alginate salts, gelatin and mixtures thereof, from about 0.2 to about 5.0 parts by weight photopolymerization initiator consisting of at least one uranyl salt selected from the group consisting of uranyl sulfate, uranyl phosphate, uranyl chloride, uranyl nitrate, uranyl carbonate, uranyl dibutyl phosphate, and mixture thereof, and from about 5 to about 45 parts by weight aminimide represented by the genera' formula:

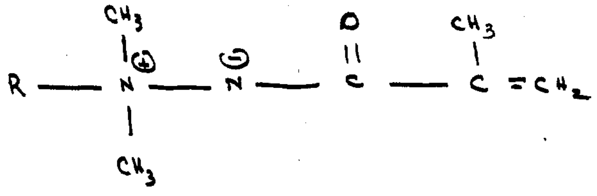

wherein R is a radical selected from the group consisting of —$CH_3$, —$CH_2CH(OH)CH_3$, —$CH_2CH(OH)CH_2OH$, —$CH_2CH(OH)(CH_2)_5CH_3$, and —$CH_2CH(OH)(CH_2)_7CH_3$, from 0 to about 5 parts by weight N, N'-methylene bisacrylamide, drying the coating to a temperature below about 150°F., whereby the emulsion configuration is maintained, exposing imagewise the dried composition coated upon the substrate to actinic light, and fixing the exposed and unexposed portions by washing with water.

14. A photosensitive element comprising a coating upon a substrate, said coating comprising a mixture of a waterinsoluble resin, selected from the group consisting of polyvinyl acetate, polyvinyl acrylate, polyvinyl methacrylate, polyvinyl acetate-acrylate, polyterpene, polystyrene and mixtures thereof, a water-soluble binder selected from the group consisting of polyvinyl alcohol, polyvinyl pyrrolidone, carboxylmethyl cellulose, polyacrylamide, alginate salts and gelatins and mixture thereof, a photopolymerization initiator selected from the group consisting of uranyl sulfate, uranyl phosphate, uranyl chloride, uranyl nitrate, uranyl carbonate, uranyl dibutyl phosphate, and mixtures thereof, and an aminimide represented by the general formula:

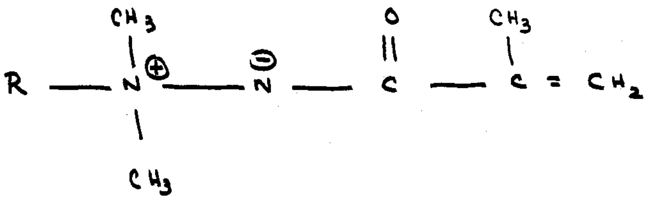

wherein R is a radical selected from the group consisting of —$CH_3$, —$CH_2CH(OH)CH_3$, $CH_2CH(OH)CH_2OH$, —$CH_2CH(OH)(CH_2)_5CH_3$, and —$CH_2CH(OH)(CH_2)_7CH_3$.

* * * * *